US009794689B2

(12) United States Patent
You

(10) Patent No.: US 9,794,689 B2
(45) **Date of Patent: *Oct. 17, 2017**

(54) ADDITION OF VIRTUAL BASS IN THE TIME DOMAIN

(71) Applicant: Guoguang Electric Company Limited, Guangzhou (CN)

(72) Inventor: Yuli You, Laguna Beach, CA (US)

(73) Assignee: Guoguang Electric Company Limited, Guangzhou (CN)

( * ) Notice: Subject to any disclaimer, the term of this patent is extended or adjusted under 35 U.S.C. 154(b) by 123 days.

This patent is subject to a terminal disclaimer.

(21) Appl. No.: 14/929,230

(22) Filed: Oct. 30, 2015

(65) Prior Publication Data

US 2017/0127182 A1 May 4, 2017

(51) Int. Cl.
*H03G 9/00* (2006.01)
*H04R 3/04* (2006.01)
(Continued)

(52) U.S. Cl.
CPC ......... *H04R 3/04* (2013.01); *G10H 2210/321* (2013.01); *G10L 21/013* (2013.01);
(Continued)

(58) Field of Classification Search
CPC ...... H04R 3/04; H04R 2430/01; H04R 3/007; H04R 2499/11; G10H 2210/321; G10L 21/038
USPC ........................................ 381/102, 98, 61, 55
See application file for complete search history.

(56) References Cited

U.S. PATENT DOCUMENTS 5,668,885 A * 9/1997 Oda .......................... H04R 3/04 381/98
5,930,373 A * 7/1999 Shashoua .............. G10L 21/038 381/61
(Continued)

FOREIGN PATENT DOCUMENTS

| | | |
|---|---|---|
| EP | 1 681 901 A1 | 7/2006 |
| WO | WO03028405 | 4/2003 |
| WO | WO 2015085924 | 6/2015 |

OTHER PUBLICATIONS

Xuejing Sun, "A Pitch Determination Algorithm Based on Subharmonic-to-Harmonic Ratio", the 6th International Conference of Spoken Language Processing, 2000, pp. 676-679.
(Continued)

*Primary Examiner* — Vivian Chin
*Assistant Examiner* — Ammar Hamid
(74) *Attorney, Agent, or Firm* — Joseph G. Swan, P.C.

(57) ABSTRACT

Provided are, among other things, systems, methods and techniques for processing an audio signal to add virtual bass. In one representative embodiment, an apparatus includes: (a) an input line that inputs an original audio signal in the time domain; (b) a bass extraction filter that extracts a bass portion of the original audio signal, which also is in the time domain; (c) an estimator that estimates a fundamental frequency of a bass sound within the bass portion; (d) a frequency translator that shifts the bass portion by a positive frequency increment that is an integer multiple of the fundamental frequency estimated by the estimator, thereby providing a virtual bass signal; (e) an adder having (i) inputs coupled to the original audio signal and to the virtual bass signal and (ii) an output; and (f) an audio output device coupled to the output of the adder.

29 Claims, 3 Drawing Sheets

(51) Int. Cl.
*H03G 5/00* (2006.01)
*G10L 21/013* (2013.01)
*G10L 25/93* (2013.01)

(52) U.S. Cl.
CPC .......... *G10L 25/93* (2013.01); *H04R 2430/01* (2013.01); *H04R 2499/11* (2013.01)

(56) References Cited

U.S. PATENT DOCUMENTS

| | | | | |
|---|---|---|---|---|
| 7,058,188 | B1 | 6/2006 | Allred | |
| 7,574,009 | B2 * | 8/2009 | Aubauer | H04R 3/04<br>381/321 |
| 8,331,570 | B2 | 12/2012 | Kasargod et al. | |
| 8,638,953 | B2 | 1/2014 | Jonsson et al. | |
| 8,971,551 | B2 | 3/2015 | Ekstrand | |
| 9,055,367 | B2 | 6/2015 | Li et al. | |
| 9,060,217 | B2 | 6/2015 | Thormundsson et al. | |
| 2007/0253576 | A1 | 11/2007 | Bai et al. | |
| 2008/0170721 | A1 | 7/2008 | Sun et al. | |
| 2010/0232624 | A1 * | 9/2010 | Zhang | H04R 3/04<br>381/103 |
| 2011/0091048 | A1 | 4/2011 | Bai et al. | |
| 2012/0106750 | A1 | 5/2012 | Thormundsson et al. | |
| 2012/0259626 | A1 * | 10/2012 | Li | H04R 1/1083<br>704/226 |

OTHER PUBLICATIONS

Alain de Cheveigne, et al., "YIN, a fundamental frequency estimator for speech and music", J. Acoust. Soc. Am. 111 (4), Apr. 2002, pp. 1917-1930.

Hao Mu; Woon-Seng Gan; Ee-Leng Tan, "A psychoacoustic bass enhancement system with improved transient and steady-state performance," in Acoustics, Speech and Signal Processing (ICASSP), 2012 IEEE International Conference on , pp. 141-144, Mar. 25-30, 2012.

David Ernesto Troncoso Romero, t al., "Digital FIR Hilbert Transformers: Fundamentals and Efficient Design Methods", MATLAB—A Fundamental Tool for Scientific Computing and Engineering Applications—vol. 1, InTech, 2012, pp. 445-482.

Sun, Xuejing, "Pitch determination and voice quality analysis using Subharmonic-to-Harmonic Ratio", IEEE, Acoustics, Speech, and Signal Processing (ICASSP), 2002 IEEE International Conference on, vol. 1, pp. 333-336.

Gan, W S et al., "Virtual Bass for Home Entertainment, Multimedia PC, Game Station and Portable Audio Systems", IEEE Transactions on Consumer Electronics, IEEE Service Center, New York, NY, US, vol. 47, No. 4, Nov. 1, 2001 (Nov. 1, 2001), pp. 787-794, XP001200505, ISSN: 0098-3063, DOI: 10.1109/30.982790.

Moon, Han-gil; Arora, Manish; et al. "Enhanced Bass Reinforcement Algorithm for Small-Sized Transducer", AES Convention 122; May 2007, AES, 60 East 42nd Street, Room 2520 New York 10165-2520, USA, May 1, 2007 (May 1, 2007), XP040508096.

Extended European Search Report in corresponding EPO application No. 16179849.1, dated Mar. 23, 2017.

Milner, B, et al, "Clean speech reconstruction from MFCC vectors and fundamental frequency using an integrated front-end", Speech Communication, Elsevier Science Publishers, Amsterdam, NL, vol. 48, No. 6, Jun. 1, 2006 (Jun. 1, 2006), pp. 697-715, XP027926247, ISSN: 0167-6393.

* cited by examiner

ADDITION OF VIRTUAL BASS IN THE TIME DOMAIN

FIELD OF THE INVENTION

The present invention pertains, among other things, to systems, methods and techniques for processing an audio signal in order to provide a listener with a stronger bass impression or, in other words, to add "virtual bass" to the audio signal, e.g., so that it can be played through a speaker or other audio-output device that does not have good bass production characteristics.

BACKGROUND

The advent of flat-panel televisions and mobile devices has accelerated the widespread use of small loudspeakers, which are well-known for their poor bass (i.e., low-frequency) performance. This characteristic typically places them in a disadvantageous position because a listener's overall impression of sound quality is strongly influenced by bass performance. It is, therefore, highly desirable to improve perceived bass performance, particularly with respect to devices that incorporate small loudspeakers.

A conventional approach to boosting bass performance is to simply amplify the low-frequency part of the audio spectrum, thereby making the bass sounds louder. However, the effectiveness of such an approach is significantly limited because small speakers typically have poor efficiency when converting electrical energy into acoustic energy at low frequencies, causing problems such as battery drain and overheating. A potentially even more serious problem is that amplification at low frequencies can cause excessive excursion of the loudspeaker's coil, leading to distortion and, in some cases, damage to the loudspeaker.

An alternative is to exploit the psychoacoustic effects of "virtual pitch". For a simple example to illustrate this effect, consider a pitch with a fundamental frequency F0 of 100 Hertz (Hz). While the sensation of a 100 Hz pitch can by produced in the human ear by playing a pure tone of 100 Hz, musical instruments and human vocal cords usually produce this sensation using a set of tones with a complex harmonic structure, such as 100 Hz, 200 Hz, 300 Hz, etc., which can also provide a fuller (and differentiated) sound quality. What is more interesting is that the tone at the fundamental frequency of 100 Hz is not necessary for people to have the sensation of hearing a 100 Hz pitch. Even if the tone of 100 Hz is missing, a set of harmonic tones at 200 Hz, 300 Hz, 400 Hz, etc., can still produce the sensation of a 100 Hz pitch. The human ear apparently can infer the pitch from the harmonic tones alone. This phenomenon is referred to as virtual pitch.

One ramification of the concept of virtual pitch is that we do not need to physically produce a tone at the fundamental frequency F0 in order to produce the sensation of a pitch at F0. When applied to bass enhancement of small loudspeakers, this means that we do not need to waste energy at low frequencies where small loudspeakers are not efficient. Instead, we can produce a similar bass impression by using higher frequency tones, which a loudspeaker is more efficient at producing. As long as an appropriate harmonic structure is provided, the virtual pitch effect can be strong enough to produce a strong bass sensation. This general approach is referred to herein as virtual bass.

Early virtual bass techniques work in the time domain and generally involve the following steps:

1. Extract low-frequency components from the input audio signal using a bandpass filter to form a bass signal;
2. Generate higher-order harmonics by feeding the bass signal through a nonlinear device;
3. Select a portion of the high-order harmonics (virtual pitch) using a bandpass filter; and
4. Add the selected high-order harmonics back into the original signal.

However, the present inventor has recognized that there are problems with this approach, including the introduction of intermodulation distortion by the nonlinear device, which can significantly degrade audio quality.

More recent techniques work in the frequency domain using phase vocoders, e.g., as follows:

1. Use a short time Fourier transform (STFT) to transform the input audio signal into the discrete Fourier transform (DFT) domain;
2. Linearly scale up the frequencies of the low-frequency harmonic tones to frequencies at which the loudspeaker can efficiently produce sound;
3. Use the scaled-up harmonic frequencies to drive sum-of-sinusoids synthesizers to synthesize a time-domain virtual bass signal; and
4. Add the virtual bass signal back into the original signal.

However, the present inventor has recognized at least one problem with this approach—that it causes the frequency differences between the harmonic tones also to be scaled up, so the resulting virtual pitch frequency is higher than it should be. In other words, the resulting virtual bass typically will be perceived as having a higher pitch than the bass portion of the original signal. Even worse, in many cases, particularly where music is involved, the foregoing shift in perceived pitch will then cause the perceived bass to clash with the other portions of the audio signal, resulting in an even more severe degradation of the sound quality.

SUMMARY OF THE INVENTION

The present invention addresses the foregoing problems through the use of certain approaches that have been found to produce better results, i.e., more realistic impressions of the original bass portion of an audio signal.

One specific embodiment of the present invention is directed to an apparatus for processing an audio signal that includes: (a) an input line that inputs an original audio signal; (b) a transform module that transforms the original audio signal into a set of frequency components; (c) a filter that extracts a bass portion of such frequency components; (d) an estimator that estimates a fundamental frequency of a bass sound within such bass portion; (e) a frequency translator that shifts the bass portion by a frequency that is an integer multiple of the fundamental frequency estimated by the estimator, thereby providing a virtual bass signal; (f) an adder having (i) inputs coupled to the original audio signal and to the virtual bass signal and (ii) an output; and (g) an audio output device coupled to the output of the adder.

Another embodiment is directed to an apparatus for processing an audio signal, which includes: (a) an input line that inputs an original audio signal in the time domain; (b) a bass extraction filter that extracts a bass portion of the original audio signal, which also is in the time domain; (c) an estimator that estimates a fundamental frequency of a bass sound within the bass portion; (d) a frequency translator that shifts the bass portion by a positive frequency increment that is an integer multiple of the fundamental frequency estimated by the estimator, thereby providing a virtual bass signal; (e) an adder having (i) inputs coupled to the original audio signal and to the virtual bass signal and (ii) an output; and (f) an audio output device coupled to the output of the adder.

By virtue of each of the foregoing arrangements, it often is possible to obtain better audio output, particularly when an audio signal is being played through a speaker or other audio output device that does not provide good bass production.

The foregoing summary is intended merely to provide brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

DESCRIPTION OF THE PREFERRED EMBODIMENT(S)

This application is related to the commonly assigned U.S. patent application titled, "Addition of Virtual Bass in the Frequency Domain", of even date herewith by the same inventor.

For ease of reference, the present disclosure is divided into sections. The general subject matter of each section is indicated by that section's heading. However, such headings are included simply for the purpose of facilitating readability and are not intended to limit the scope of the invention in any manner whatsoever.

Addition of Virtual Bass in the Frequency Domain.

Figure 1:
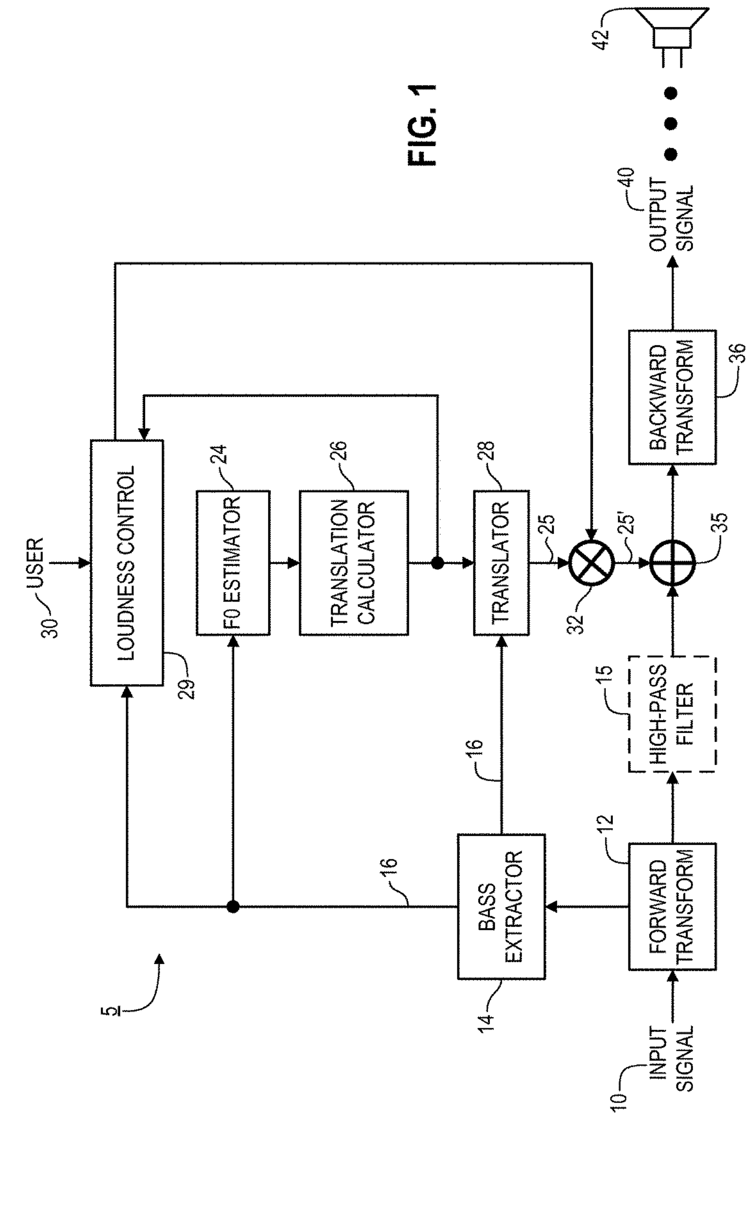
FIG. 1 is a block diagram of a system for adding virtual bass to an audio signal in the frequency domain.

The first embodiment of the present embodiment, which primarily operates in the frequency domain, is now discussed in reference to FIG. 1. As discussed in greater detail below, FIG. 1 illustrates a system 5 for processing an original input audio signal 10 (typically in digital form, i.e., discrete or sampled in time and discrete or quantized in value), in order to produce an output audio signal 40 that can have less actual bass content than original signal 10, but added "virtual bass", e.g., making it more appropriate for speakers or other output devices that are not very good at producing bass.

Referring to FIG. 1, initially, forward-transform module 12 transforms input audio signal 10 from the time domain into a frequency-domain (e.g., DFT) representation. Conventional STFT or other conventional frequency-transformation techniques can be used within module 12. In the following discussion, it generally is assumed that STFT is used, resulting in a DFT representation, although no loss of generality is intended, and each specific reference herein can be replaced, e.g., with the foregoing more-generalized language.

The resulting transformed signal is then provided (i.e., coupled) to bass extractor 14 and, optionally, to a high-pass filter 15. Bass extractor 14 extracts the low-frequency portion 16 of the input signal 10 from the DFT (or other frequency) coefficients, e.g., using a bandpass filter with a pass band (e.g., that portion of the spectrum subject to not more than 3 dB of attenuation) of $$[f_l^b, f_h^b], \quad \text{Equation 1}$$

where $f_l^b$ is the low-end cutoff (−3 dB) frequency, $f_h^b$ is the high-end cutoff frequency, and the foregoing range preferably is centered where the bass is anticipated to be strong but the intended loudspeaker or other ultimate output device(s) 42 cannot efficiently produce sound. In addition, the bandwidth of bass extractor 14 preferably spans enough octaves (e.g., at least 1, 2 or more) so as to extract adequate harmonic structure from the source audio signal 10 for the purposes indicated below. One representative example of such a pass band is [40, 160] Hz. More generally, $f_l^b$ preferably is at least 10, 15, 20 or 30 Hz, and $f_h^b$ preferably is 100-200 Hz.

Typically, bass extractor 14 suppresses the higher-frequency components of input signal 10 (and preferably also suppresses very low-frequency components, e.g., those below the range of human hearing), e.g., by directly applying a window function, having the desired filter characteristics, to the frequency coefficients provided by forward STFT module 12. In the preferred embodiments, the purpose of bass extractor 14 is to output the bass signal (including its fundamental frequency and at least a portion of its harmonic structure) that is desired to be replicated as virtual bass (e.g., excluding any very low-frequency energy that is below the range of human hearing).

As shown in FIG. 1, extracted bass signal 16 is provided to F0 estimator 24 which is used to estimate the fundamental frequency F0 of a bass sound (or pitch) within bass signal 16 to which the virtual bass signal 25 that is being generated is intended to correspond (i.e., the bass sound that virtual bass signal 25 is intended to replace). It is noted that in the discussion herein, the fundamental frequency is interchangeably referred to as F0 or $F_0$. While any F0 detection algorithm may be used to provide an estimate of the fundamental frequency F0, methods in the frequency domain are preferred in the current embodiment due to the availability of the DFT (or other frequency) spectrum. Typically, implicit in such techniques is an identification of the principal sound or pitch (in this case, the principal bass sound or pitch) within the audio signal being processed for which the fundamental frequency is determined. In this regard, the present inventor has discovered that the production of the sensation of a single bass sound or pitch at any given moment can provide good sound quality. Currently, the preferred approach is as described in Xuejing Sun, "A Pitch Determination Algorithm Based on Subharmonic-to-Harmonic Ratio", The $6^{th}$ International Conference of Spoken Language Processing, 2000, pp. 676-679 and/or in Xuejing Sun, "Pitch Determination and Voice Quality Analysis Using Subharmonic-to-Harmonic Ratio", 2002 IEEE International Conference on Acoustics, Speech, and Signal Processing (ICASSP), vol. 1, pp. I-3334-336, 13-17 May 2002.

A smoothing mechanism optionally may be employed to ensure smooth transitions between audio frames (i.e., smooth variations in F0 from frame to frame). One such embodiment uses the following first-order infinite impulse response (IIR) filter:

$$\hat{F}_0(n)=\alpha\hat{F}_0(n-1)+(1-\alpha)F_0(n)$$

where n is the frame number, $\hat{F}_0$ is the smoothed F0, and α is the filter coefficient and is related to sampling frequency $f_s$, and time constant τ as $$\alpha = e^{-\frac{1}{\tau f_s}}.$$

Bass does not present in an audio signal at all times. When it is absent for a frame of audio, the virtual bass enhancement mechanism optionally may be disabled. Turning the virtual bass mechanism on and off in this manner often will produce a stronger and more desirable bass contrast. For this purpose, most F0 detection algorithms produce a F0 salience value for each audio frame, which typically indicates the strength of the pitch harmonic structure in the frame. For example, the sum of harmonic amplitude (SH) and the subharmonic to harmonic ratio (SHR) mentioned in the above-referenced Sun articles can be used as salience functions when those F0 detection algorithms are used. In the case of SH, the stronger the harmonic structure, the higher the salience value is. On the other hand, SHR provides a reverse relationship: the higher the SHR, the weaker the harmonic structure is.

In any event, the selected F0 salience value can be readily employed to implement this on/off mechanism. For example, in certain embodiments if the F0 salience value in a given frame is lower (or higher, depending on the nature of the salience value, as indicated in the preceding paragraph) than a specified (e.g., fixed or dynamically set) threshold (or otherwise does not satisfy a specified criterion, e.g., pertaining to a specified threshold), the virtual bass mechanism is turned off (e.g., virtual bass signal 25 is set or forced to 0 for that frame). As indicated above, there are many potential salience functions, producing different salience values. Each of such salience functions typically has a number of parameters that can be tuned, so the appropriate threshold value (for turning the virtual bass functionality on and off) for a given salience value that is to be used preferably is determined experimentally. For example, the threshold value may be based on subjective quality assessments from a test group of individual evaluators. Alternatively, rather than using a fixed threshold value that has been determined to be "optimal" in some sense, the user 30 may be provided with a user interface element that allows the user 30 to adjust the value, e.g., according to his or her individual preferences and/or based on the nature of the particular sound (or type of sound) that currently is being produced. In still further embodiments, a combination of these approaches is used (e.g., allowing the user 30 to adjust the value when desired and employing a machine-learning algorithm to set the value, based on previous user settings, in those instances in which the user 30 has not specified a setting).

The F0 estimate is provided from estimator 24 to translation calculator 26, which calculates the frequency translation that frequency translator 28 subsequently will use to translate the bass signal 16 (e.g., to frequencies at which the output device 42 can produce sound efficiently). In order to properly maintain the harmonic structure of the bass signal, the frequencies of the translated harmonic tones preferably are integer multiples of the fundamental frequency F0, so the value of frequency translation preferably is:

$$\Delta = kF_0$$

where k is a positive integer, referred to herein as the frequency translation multiplier. Using such a frequency translation multiplier, a set of bass harmonic frequencies at $$F_0, 2F_0, 3F_0, \ldots$$

will be translated (in translator 28) to a set of target harmonic frequencies at $$F_0+kF_0, 2F_0+kF_0, 3F_0+kF_0, \ldots$$

In this way, the difference between the target harmonic frequencies is still F0 and each harmonic frequency is still an integer multiple of F0. Therefore, this set of harmonic frequencies will produce the sensation of the missing virtual pitch. In addition, the translation of the frequencies surrounding $F_0$ by the same amount (Δ) often can preserve the original bass quality, from a perceptual standpoint.

The frequency translation multiplier preferably ensures that the bass signal is shifted to frequencies at which the loudspeaker can efficiently produce sound. In this regard, if $f_l^t$ denotes the lowest frequency at which the loudspeaker can efficiently produce sound, one such frequency translation multiplier for a bass signal with a passband given by Equation 1 may be determined as:

$$k = \left\lceil \frac{f_l^t}{f_l^b} \right\rceil - 1, \quad \text{Equation 2}$$

where ⌈x⌉ is the ceiling function which returns the smallest integer that is greater than or equal to x. For the range of the extracted bass signal 16 (which is assumed to include F0) given in Equation 1, the corresponding range of the translated (frequency-shifted) F0 will then be:

$$[f_l^b(k+1), f_h^b(k+1)]. \quad \text{Equation 3}$$

When the estimated F0 is on the high end of the range given in Equation 1, the multiplier k specified above may cause the bass signal to be translated to a very high frequency range, leading to a less desirable bass perception. This problem may be alleviated by instead using the following multiplier:

$$k = \left\lceil \frac{f_l^t}{F_0} \right\rceil - 1. \quad \text{Equation 4}$$

This multiplier is a function of the estimated F0 and, therefore, varies from frame to frame as the estimated F0 changes. In order to limit the effects of a discontinuity when the estimated F0 changes around a value which leads to $f_l^t/F_0$ being an integer, preferably a one-octave F0 range at the top of the range given in Equation 1 is set as the range for the allowed F0 estimate, i.e., so that the F0 estimate is constrained to be within the range:

$$\left[\frac{1}{2} f_h^b, f_h^b\right], \quad \text{Equation 5}$$

and any initial F0 estimate is shifted into this range by raising its octave. Then, the translation multiplier may be obtained as:

$$k = \left\lceil \frac{f_l^t + \frac{1}{2} f_h^b - f_l^b}{\frac{1}{2} f_h^b} \right\rceil - 1, \quad \text{Equation 6}$$

which is a fixed value. Because this modified F0 estimate is confined to the range specified in Equation 5, the corresponding range of the translated (shifted) F0 is $$\left[\frac{1}{2} f_h^b (k+1),\ f_h^b (k+1)\right],$$

which is significantly smaller than the range specified by Equation 3.

Another advantage of defining the multiplier k as set forth in Equation 6 is that it renders irrelevant the problem of octave error, which is a common problem for most F0 detection algorithms. In this regard, it is noted that F0 detection algorithms tend to produce an estimate that is one or more octaves higher or lower than the real one. Such an error would cause a bass signal to be translated to dramatically different frequencies if Equation 2 or Equation 4 is used. This problem becomes irrelevant when Equation 6 is used because the estimated F0 is converted to the range of Equation 5.

Translation calculator 26 provides the translation information (e.g., either Δ alone, or k together with $F_0$) to frequency translator 28, which preferably translates (or shifts) the entire extracted bass signal 16 by the fixed frequency increase Δ (e.g., to frequencies where the loudspeaker or other output device(s) 42 can produce sound efficiently), while ensuring that the harmonic structure of the bass signal 16 is left unchanged. The frequency representation of the virtual bass signal V(f,n) of the n-th STFT frame can be obtained from the frequency representation of the bass signal 16, B(f,n), e.g., as $$V(f,n)=B(f-\Delta,n)e^{j2\pi\Delta nM},$$

where M is the block size of the STFT. The phase adjustment indicated above is desirable to ensure smooth phase transitions between successive STFT frames. See, e.g., J. Laroche and M. Dolson, "New phase-vocoder techniques for real-time pitch shifting, chorusing, harmonizing, and other exotic audio modifications," Journal of the Audio Engineering Society, 47.11 (1999): pp. 928-936, It is noted that in the presently preferred embodiment, F0 is constrained to be a frequency corresponding to a transform frequency (e.g., DFT) bin and, therefore, Δ is an integer multiple of the frequency bin width. For the present purposes, adoption of such a constraint has been found to significantly simplify the required processing without causing any substantial degradation in quality. However, it is possible to accommodate the fractional case, and systems and processes that do so are intended to be included within the scope of the present invention. The article by Laroche and Dolson cited in the preceding paragraph discusses an approach along these lines.

Because human loudness perception is less sensitive at low frequencies, absent adjustment, the virtual bass signal 25 that is to be added in system 5 (which consists of a set of higher frequencies) typically would sound (i.e., be perceived as being) much louder than the actual bass that is present in the original signal 10. However, it is preferable to make the added virtual bass sound as loud as the original bass so that the perceived loudness balance is maintained. Toward this end, the main purpose of loudness control module 29 is to estimate the change in the perceived loudness level of the virtual bass signal 25, as compared to the original bass in input signal 10, and then use that information to generate a scale factor that is intended to equalize the two, i.e., to estimate the optimal volume adjustment for the virtual bass signal 25 so that the virtual bass blends well with the original audio signal 10. In addition, in certain embodiments, system 5 presents a user interface allows a user 30 to adjust a setting that results in a modification to this scale factor in order to suit the user 30's preferences (e.g., increased or decreased bass sensation).

Preferably, loudness control module 29 first estimates the sound pressure level (SPL) or the power of the extracted bass signal 16. One approach to doing so is to calculate the following average of power over the pass band, e.g.:

$$L_p^B = 10\log_{10}\frac{1}{H-L+1}\sum_{n=L}^{H}|X_n|^2$$

where $x_n$ is the n-th DFT coefficient, L and H are the lowest and highest, respectively, DFT bin numbers within bass signal 16. In addition, loudness control module 29 preferably identifies a representative or nominal frequency within the extracted bass signal 16. The geometric mean may be used to calculate this representative or nominal frequency for the original bass signal 16, e.g. as:

$$f_B = \left(\prod_{f_n=f_l^b}^{f_h^b} f_n\right)^{\frac{1}{H-L+1}}$$

where $f_n$ is the frequency of the n-th DFT bin. This representative or nominal frequency and power can then be plugged into equation (2) of ISO 226:2003 to obtain the loudness level $L_N$ of the original bass signal 16.

Similarly, the representative or nominal frequency for the corresponding virtual bass signal 25 may be calculated as follows:

$$f_V = \left(\prod_{f_n=f_l^b}^{f_h^b} f_n + kF_0\right)^{\frac{1}{H-L+1}}.$$

This representative or nominal frequency $f_V$ and the loudness level $L_N$ can then be plugged into equation (1) of ISO 226:2003 to obtain the target SPL, $L_p^V$, which can then be converted into the target scale factor s as:

$$s=10^{0.05L_p^V}.$$

This scale factor s, either with or without modification by a user 30 (e.g., as discussed above), is then provided to multiplier 32, along with the virtual bass signal 25, in order to produce the desired volume-adjusted virtual bass signal 25'. The combination of loudness control module 29 and multiplier 32 collectively can be referred to herein as a "loudness controller" or a "loudness equalizer". Also, although ISO 226:2003 is referenced herein, any other (e.g., similar) equal-loudness-level data set instead may be used.

As noted above, the frequency-domain transformed version of input signal 10 also may be provided to an optional high-pass filter 15. The purpose of high-pass filter 15 (if provided) is to suppress the entire lower portion of the spectrum that cannot be efficiently reproduced by the intended output device(s) 42. For example, frequencies below a specified frequency (e.g., having a value of 50-200 Hz) might be filtered out by high-pass filter 15. It should be noted that, particularly because it is preferable for bass extractor 14 to extract at least a portion of the harmonic structure of the bass pitch (or sound), there might be overlap between the frequency spectrum of bass signal 16 and the spectrum that high-pass filter 15 passes through. Similar to bass extractor 14, high-pass filter 15 (if provided) typically performs its filtering operation (i.e., in this case, suppressing the low-frequency components of input signal 10), e.g., by directly applying a window function with the desired filter characteristics to the frequency coefficients provided by transform module 12. As previously indicated, a high-pass filter 15 can reduce the amount of energy that, e.g., otherwise would be wasted in small loudspeakers or might result in other negative effects, but it is neither an essential nor necessary part of a virtual-bass system, process or approach according to the present invention.

In adder 35, the frequency-domain virtual bass signal 25' is summed with the frequency-transformed and potentially high-pass filtered input signal. Finally, the backward transformation (i.e., the reverse of the transformation performed in module 12) is performed in module 36 in order to convert the composite signal back into the time domain. The resulting output signal 40 typically is subject to additional processing (e.g., digital-to-analog conversion, loudness compensation, such as discussed in commonly assigned U.S. patent application Ser. No. 14/852,576, filed Sep. 13, 2015, which is incorporated by reference herein as though set forth herein in full, and/or amplification) before being provided to speaker or other output device(s) 42. Alternatively, any or all of such additional processing may have been performed on input signal 10 prior to providing it to system 5.

Addition of Virtual Bass in the Time Domain.

Figure 2:
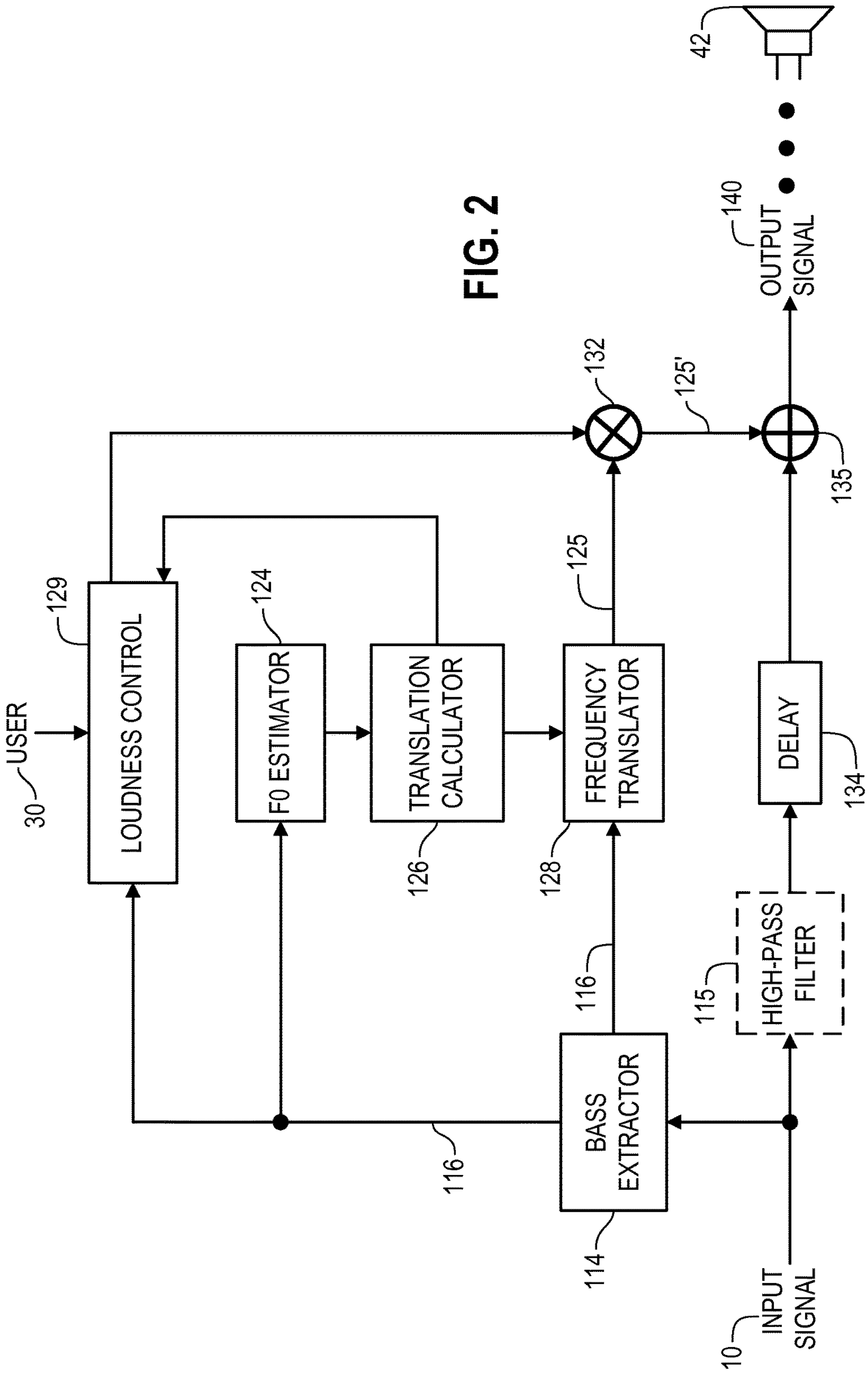
FIG. 2 is a block diagram of a system for adding virtual bass to an audio signal in the time domain.

An alternate embodiment of the present embodiment, which operates entirely in the time domain, is now discussed primarily in reference to FIG. 2. As discussed in greater detail below, FIG. 2 illustrates a system 105 for processing an original input audio signal 10 (typically in digital form), in order to produce an output audio signal 140 that, as in system 5 discussed above, can have less actual bass content than original signal 10, but added "virtual bass", e.g., making it more appropriate for speakers or other output devices that are not very good at producing bass.

Referring to FIG. 2, initially, bass extractor 114 extracts the low-frequency portion of the input signal 10 (e.g., other than a very low-frequency portion that is below the range of human hearing), preferably using a bandpass filter. Like bass extractor 14, the passband of bass extractor 114 preferably is as specified in Equation 1, and the characteristics of bass extractor 114 are the same as those of bass extractor 14, except that bass extractor 114 operates in the time domain. Conventional finite impulse response (FIR) or IIR filters may be used for bass extractor 114. The extracted bass signal (or bass portion) 116 is provided to F0 estimator 124.

While any F0 detection algorithm may be used by F0 estimator 124 to provide an estimate of the fundamental frequency F0, in order to avoid additional complexity, methods in the time domain are preferred in the current embodiment. The preferred F0 detection algorithm examines a specified number of audio samples, referred to as the integration window, having a size that preferably is at least twice the period corresponding to the minimum expected F0. After the F0 value is obtained, the audio samples preferably are advanced by a number of samples, referred to as a frame, having a size that preferably is a fraction of (i.e., smaller than) that of the integration window. If the F0 estimate is updated frequently (i.e., the frame size is small compared with the integration window), a simple F0 detection method, such as the zero-crossing rate (ZCR) method, preferably is used in order to maintain a reasonable computation load. On the other hand, if the F0 estimate is updated infrequently, more sophisticated methods, such as the YIN estimation method, as discussed, e.g., in Kawahara H. de Cheveigné, "YIN, a fundamental frequency estimator for speech and music", J Acoust Soc Am., Apr 2002, 111(4):1917-30, can be used to provide a more reliable and accurate F0 estimate. In addition, as with F0 estimator 24, F0 estimator 124 preferably also employs a (e.g., similar or identical) smoothing mechanism to smooth variations in the F0 estimate between audio frames and/or a salience measure estimate and corresponding threshold (or similar or related criterion) to turn the virtual bass mechanism on and off within individual frames.

The F0 estimate generated by estimator 124 is provided to translation calculator 126, which preferably is similar or identical to translation calculator 26, discussed above, and the same considerations generally apply. The output of translation calculator 126 (e.g., either Δ alone, or k together with $F_0$) is then provided to frequency translator 128 and loudness control module 129.

Frequency translator 128 translates (or frequency shifts) the entire extracted bass signal 116 by the calculated positive frequency increment Δ, e.g., to frequencies where the loudspeaker can produce sound efficiently, while ensuring that the harmonic structure of the bass signal is left unchanged. A simple way to implement frequency translator 128 is to use double-sideband (DSB) modulation, e.g., as follows:

$$v(n)=b(n)\cos(2\pi f_c n),$$

where n is the sample index, $f_c$ is the carrier frequency (e.g., Δ), b (n) is the extracted bass signal 116, and v(n) is the resulting virtual bass signal 125, respectively. Using the modulation theorem of the Fourier transform, we obtain the spectrum of the virtual bass signal, V(f), as:

$$V(f)=\frac{1}{2}[B(f-f_c)+B(f+f_c)],$$

where B(f) is the spectrum of the extracted bass signal 116. As indicated above, the virtual bass spectrum consists of two sidebands, or frequency-shifted copies of the bass spectrum, on either side of the carrier frequency, with the lower sideband being a frequency-flipped or mirrored copy of the bass spectrum. If the carrier frequency is set to be a multiple of the estimated F0, both sidebands can still maintain a valid harmonic structure, so the virtual bass spectrum B(f) constitutes a valid virtual signal.

There are other options for selecting the carrier frequency $f_c$. One is to select such a value that both the lower and higher sidebands are translated to the frequency range where the loudspeaker can efficiently produce sound. This approach would result in there being two frequency-shifted copies of the bass spectrum in the virtual bass signal 125: the lower sideband and the upper sideband, so the timber of the virtual bass signal would be significantly altered. Another option is to select the carrier frequency $f_c$ to be such a value that only the upper sideband is translated to the frequency range where the loudspeaker can efficiently produce sound. Because the fundamental bass frequency is F0, such a carrier frequency preferably is selected as:

$$f_c = kf_0,$$

which ensures that the lower sideband is below the frequencies where the loudspeaker can efficiently produce sound, so the effect of the lower sideband on timber is limited. However, this lower sideband typically does produce excessive heat and coil excursion and, therefore, should be suppressed.

When the lower sideband is suppressed, the resulting frequency translation approach is referred to as single-sideband (SSB) modulation. One approach to SSB modulation is to employ a bandpass filter to filter out the lower sideband. This filter preferably has a bandwidth that is similar or identical to that of the extracted bass signal 116, but its center frequency preferably varies with the estimated F0. Due to the varying center frequency, a FIR filter such as the following truncated ideal bandpass filter preferably is used:

$$h(n) = \begin{cases} \frac{\sin[2\pi f_h(n-M)]}{\pi(n-M)} - \frac{\sin[2\pi f_l(n-M)]}{\pi(n-M)}, & n \neq M \\ 2(f_h - f_l), & n = M \end{cases},$$

where N is the length of the filter, M=N/2, and $f_l$ and $f_h$ are frequencies corresponding to the low and high edges, respectively, of the passband.

Figure 3:
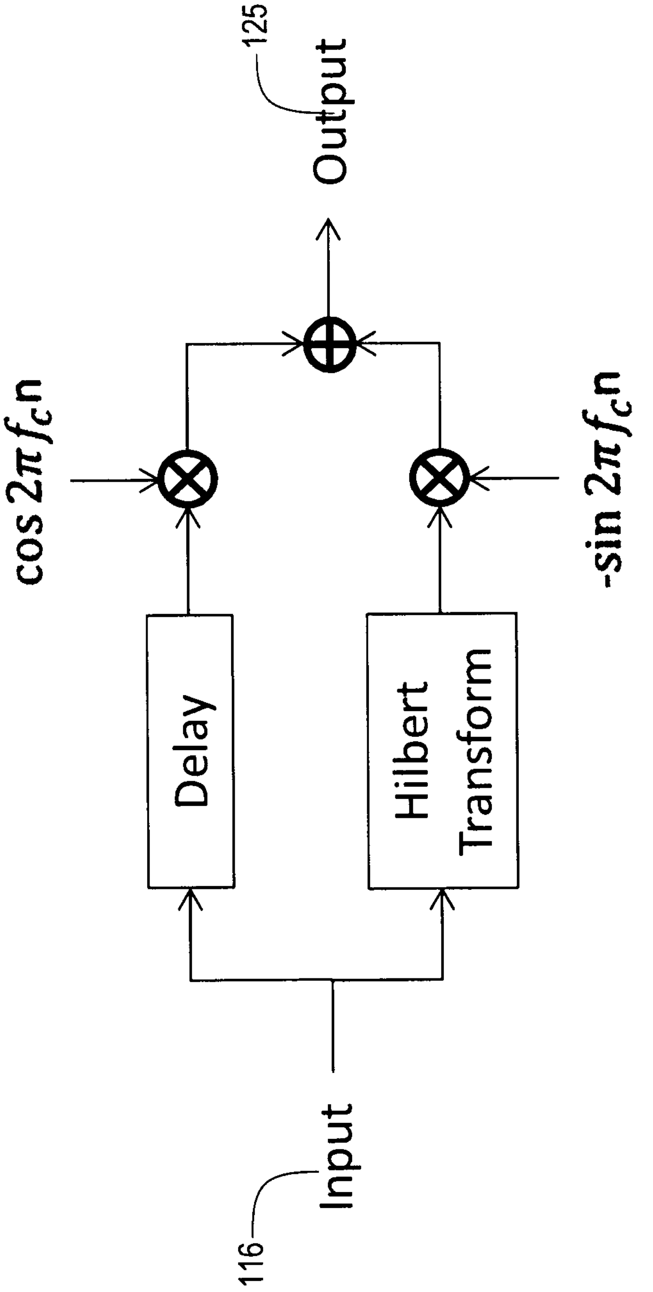
FIG. 3 (Prior Art)
FIG. 3 is a block diagram of a system for performing single-sideband (SSB) modulation.

A currently more preferred approach to SSB modulation is to use the Hilbert transform to create an analytic signal from the extracted bass signal 116, translate that analytic signal to the desired frequency, and take its real part. One algorithm to efficiently implement this process is illustrated in FIG. 3. The Hilbert transform may be approximated by a FIR filter, which can be designed using the Parks-McClellan algorithm (e.g., as discussed in David Ernesto Troncoso Romero and Gordana Jovanovic Dolecek, "Digital FIR Hilbert Transformers: Fundamentals and Efficient Design Methods", chapter 19 in "MATLAB—A Fundamental Tool for Scientific Computing and Engineering Applications—Volume 1", Prof. Vasilios Katsikis (Ed.), Intech, ISBN: 978-953-51-0750-7, InTech, DOI: 10.5772/46451, pp. 445-482 (2012). For implementation using IIR filters, see, e.g., Scott Wardle, "A Hilbert transformer frequency shifter for audio," First Workshop on Digital Audio Effects DAFx, 1998.

As shown in FIG. 2, the extracted bass signal 116 and the output of translation calculator 126 (e.g., either Δ alone, or k together with $F_0$) are provided to loudness control module 129, which preferably provides functionality similar to loudness control module 29, discussed above, but operates in the time domain. For example, in this embodiment a sliding average of power values within extracted bass signal 116 may be calculated as follows:

$$P(n) = \Sigma_{k=0}^{N-1} x^2(n-k), \quad \text{Equation 7}$$

where x(n) is the input sample value and N is the block size. A simpler embodiment is to use a low-order IIR filter, such as the following first-order IIR filter:

$$P(n) = \alpha P(n-1) + (1-\alpha)x^2(n), \quad \text{Equation 8}$$

where α is the filter coefficient and is related to sampling frequency $f_s$ and time constant τ as $$\alpha = e^{-1/(\tau f_s)}.$$

The representative or nominal frequency for the bass signal may be calculated, e.g., using either the arithmetic mean of the limit given in Equation 1 or the following geometric mean:

$$f_B = \sqrt{f_l^b f_h^b}.$$

This representative or nominal frequency and the calculated bass power (e.g., as given in Equation 7 or Equation 8) can then be plugged into equation (2) of ISO 226:2003 to obtain its loudness level $L_N$.

The frequency range of the virtual bass signal 125 is $$[f_l^b + kF_0, f_h^b + kF_0]$$

Therefore, the representative or nominal frequency for the virtual bass signal 125 may be calculated as the arithmetic mean of the limit above or as its geometric mean, e.g.:

$$f_V = \sqrt{(f_l^b + kF_0)(f_h^b + kF_0)}.$$

This representative or nominal frequency and the loudness level $L_N$ can then be plugged into equation (1) of ISO 226:2003 to obtain the target SPL $L_p^V$, which can be further converted into the scale factor, e.g., as:

$$s = 10^{0.05 L_p V}.$$

As in the preceding embodiment, this scale factor s preferably may be modified by a user 30. With or without such modification, scale factor s is then provided to multiplier 132, along with the virtual bass signal 125, in order to produce the desired volume-adjusted virtual bass signal 125'. The combination of loudness control module 129 and multiplier 132 collectively can be referred to herein as a "loudness controller" or a "loudness equalizer".

Input signal 10 also may be provided to an optional high-pass filter 115. Similar to high-pass filter 15 (if provided), filter 115 preferably suppresses the entire lower portion of the spectrum of the input audio signal 10 that cannot be efficiently reproduced by the intended output device(s) 42. The preferred frequency characteristics of filter 115 (if provided) the same as those provided above for filter 15. However, filter 115 (if provided) operates in the time domain (e.g., implemented as a FIR or IIR filter).

Following filter 115 (if provided), a delay element 134 delays the potentially filtered original audio signal to time-align it to the synthesized virtual bass signal 125'. Thereafter, the two signals are summed in adder 135. The resulting output signal 140 typically is subject to additional processing (e.g., as discussed above in relation to system 5) before being provided to speaker or other output device(s) 42. Alternatively, as with system 5, any or all of such additional processing may have been performed on input signal 10 prior to providing it to system 105.

System Environment.

Generally speaking, except where clearly indicated otherwise, all of the systems, methods, functionality and techniques described herein can be practiced with the use of one or more programmable general-purpose computing devices. Such devices (e.g., including any of the electronic devices mentioned herein) typically will include, for example, at least some of the following components coupled to each other, e.g., via a common bus: (1) one or more central processing units (CPUs); (2) read-only memory (ROM); (3) random access memory (RAM); (4) other integrated or attached storage devices; (5) input/output software and circuitry for interfacing with other devices (e.g., using a hardwired connection, such as a serial port, a parallel port, a USB connection or a FireWire connection, or using a wireless protocol, such as radio-frequency identification (RFID), any other near-field communication (NFC) protocol, Bluetooth or a 802.11 protocol); (6) software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; (7) a display (such as a cathode ray tube display, a liquid crystal display, an organic light-emitting display, a polymeric light-emitting display or any other thin-film display); (8) other output devices (such as one or more speakers, a headphone set, a laser or other light projector and/or a printer); (9) one or more input devices (such as a mouse, one or more physical switches or variable controls, a touchpad, tablet, touch-sensitive display or other pointing device, a keyboard, a keypad, a microphone and/or a camera or scanner); (10) a mass storage unit (such as a hard disk drive or a solid-state drive); (11) a real-time clock; (12) a removable storage read/write device (such as a flash drive, any other portable drive that utilizes semiconductor memory, a magnetic disk, a magnetic tape, an opto-magnetic disk, an optical disk, or the like); and/or (13) a modem (e.g., for sending faxes or for connecting to the Internet or to any other computer network). In operation, the process steps to implement the above methods and functionality, to the extent performed by such a general-purpose computer, typically initially are stored in mass storage (e.g., a hard disk or solid-state drive), are downloaded into RAM, and then are executed by the CPU out of RAM. However, in some cases the process steps initially are stored in RAM or ROM and/or are directly executed out of mass storage.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, one or more server boxes, workstations, personal (e.g., desktop, laptop, tablet or slate) computers and/or even smaller computers, such as personal digital assistants (PDAs), wireless telephones (e.g., smartphones) or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server, server device, computer-readable medium or other storage device, client device, or any other kind of apparatus or device, such references should be understood as encompassing the use of plural such processors, computers, servers, server devices, computer-readable media or other storage devices, client devices, or any other such apparatuses or devices, except to the extent clearly indicated otherwise. For instance, a server generally can (and often will) be implemented using a single device or a cluster of server devices (either local or geographically dispersed), e.g., with appropriate load balancing. Similarly, a server device and a client device often will cooperate in executing the process steps of a complete method, e.g., with each such device having its own storage device(s) storing a portion of such process steps and its own processor(s) executing those process steps.

As used herein, the term “coupled”, or any other form of the word, is intended to mean either directly connected or connected through one or more other elements or processing blocks. In the drawings and/or the discussions of them, where individual steps, modules or processing blocks are shown and/or discussed as being directly connected to each other, such connections should be understood as couplings, which may include additional elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein.

Additional Considerations.

In the preceding discussion, the terms “operators”, “operations”, “functions” and similar terms can refer to method steps or hardware components, depending upon the particular implementation/embodiment.

Unless clearly indicated to the contrary, words such as “optimal”, “optimize”, “minimize”, “best”, as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing constraints.

References herein to a “criterion”, “multiple criteria”, “condition”, “conditions” or similar words which are intended to trigger, limit, filter or otherwise affect processing steps, other actions, the subjects of processing steps or actions, or any other activity or data, are intended to mean “one or more”, irrespective of whether the singular or the plural form has been used. For instance, any criterion or condition can include any combination (e.g., Boolean combination) of actions, events and/or occurrences (i.e., a multi-part criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

In the discussions above, the words “include”, “includes”, “including”, and all other forms of the word should not be understood as limiting, but rather any specific items following such words should be understood as being merely exemplary.

Several different embodiments of the present invention are described above [and in the documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention are to be considered as within the scope thereof as limited solely by the claims appended hereto.

What is claimed is:

1. An apparatus for processing an audio signal, comprising:
- (a) an input line that inputs an original audio signal in a time domain;
- (b) a bass extraction filter that extracts a bass portion of said original audio signal, said extracted bass portion also being in the time domain;
- (c) an estimator that estimates a fundamental frequency of a bass sound within said bass portion;
- (d) a frequency translator that shifts the bass portion by a positive frequency increment that is an integer multiple of the fundamental frequency estimated by said estimator, thereby providing a virtual bass signal;
- (e) an adder having (i) inputs coupled to said original audio signal and to said virtual bass signal and (ii) an output; and
- (f) an audio output device coupled to the output of said adder, wherein said estimator and said frequency translator operate on discrete frames of the original audio signal, and further comprising a smoothing filter that adjusts the fundamental frequency in individual ones of said discrete frames to smooth changes in the fundamental frequency across said frames.

2. An apparatus according to claim 1, wherein said bass extraction filter is a bandpass filter having a low-end cutoff frequency of at least 15 Hz.

3. An apparatus according to claim 1, wherein said bass extraction filter is a bandpass filter having a passband of at least 1 octave.

4. An apparatus according to claim 1, wherein said bass extraction filter is a bandpass filter having a passband of at least 2 octaves.

5. An apparatus according to claim 1, further comprising a loudness controller that adjusts a strength of said virtual bass signal based on a first estimate of a perceived loudness of said bass portion and a second estimate of a perceived loudness of said virtual bass signal.

6. An apparatus according to claim 5, wherein the first estimate is based on an estimate of at least one of a sound pressure level (SPL) or a power of the bass portion.

7. An apparatus for processing an audio signal, comprising:
- (a) an input line that inputs an original audio signal in a time domain;
- (b) a bass extraction filter that extracts a bass portion of said original audio signal, said extracted bass portion also being in the time domain;
- (c) an estimator that estimates a fundamental frequency of a bass sound within said bass portion;
- (d) a frequency translator that shifts the bass portion by a positive frequency increment that is an integer multiple of the fundamental frequency estimated by said estimator, thereby providing a virtual bass signal;
- (e) an adder having (i) inputs coupled to said original audio signal and to said virtual bass signal and (ii) an output;
- (f) an audio output device coupled to the output of said adder; and
- (g) a loudness controller that adjusts a strength of said virtual bass signal based on a first estimate of a perceived loudness of said bass portion and a second estimate of a perceived loudness of said virtual bass signal, wherein the loudness controller determines a scale factor based on a representative frequency for the bass portion, a strength of the bass portion, a representative frequency for the virtual bass signal and an equal-loudness-level data set.

8. An apparatus according to claim 7, wherein the representative frequency for the bass portion is determined using at least one of a geometric mean or an arithmetic mean across the bass portion.

9. An apparatus for processing an audio signal, comprising:
- (a) an input line that inputs an original audio signal in a time domain;
- (b) a bass extraction filter that extracts a bass portion of said original audio signal, said extracted bass portion also being in the time domain;

(c) an estimator that estimates a fundamental frequency of a bass sound within said bass portion;

(d) a frequency translator that shifts the bass portion by a positive frequency increment that is an integer multiple of the fundamental frequency estimated by said estimator, thereby providing a virtual bass signal;

(e) an adder having (i) inputs coupled to said original audio signal and to said virtual bass signal and (ii) an output; and (f) an audio output device coupled to the output of said adder, wherein said estimator estimates the fundamental frequency based on audio samples within an integration window that has a size of at least two times a period corresponding to a minimum expected fundamental frequency.

10. An apparatus according to claim 9, wherein said estimator and said frequency translator operate on discrete frames of the original audio signal, with individual ones of said discrete frames having a size that is a fraction of that of the size of the integration window used for said individual ones of said discrete frames.

11. An apparatus for processing an audio signal, comprising:

(a) an input line that inputs an original audio signal in a time domain;

(b) a bass extraction filter that extracts a bass portion of said original audio signal, said extracted bass portion also being in the time domain;

(c) an estimator that estimates a fundamental frequency of a bass sound within said bass portion;

(d) a frequency translator that shifts the bass portion by a positive frequency increment that is an integer multiple of the fundamental frequency estimated by said estimator, thereby providing a virtual bass signal;

(e) an adder having (i) inputs coupled to said original audio signal and to said virtual bass signal and (ii) an output; and (f) an audio output device coupled to the output of said adder, wherein said estimator also estimates a salience value of said bass sound, and wherein said virtual bass signal is forced to 0 if said salience value does not satisfy a specified criterion.

12. An apparatus according to claim 1, wherein the fundamental frequency of said bass sound is constrained to fall within a one-octave range.

13. An apparatus according to claim 1, wherein the frequency translator uses single-sideband (SSB) modulation.

14. An apparatus according to claim 11, wherein said estimator and said frequency translator operate on discrete frames of the original audio signal, and further comprising a smoothing filter that adjusts the fundamental frequency in individual ones of said discrete frames to smooth changes in the fundamental frequency across said frames.

15. An apparatus according to claim 1, wherein said smoothing filter implements a smoothing function $\hat{F}_0(n)=\alpha\hat{F}_0(n-1)+(1-\alpha)F_0(n)$, where n is a number of the current frame number, $\hat{F}_0$ is a smoothed version of $F_0$, and $\alpha$ is a filter coefficient.

16. An apparatus for processing an audio signal, comprising:

(a) an input line that inputs an original audio signal in a time domain;

(b) a bass extraction filter that extracts a bass portion of said original audio signal, said extracted bass portion also being in the time domain;

(c) an estimator that estimates a fundamental frequency of a bass sound within said bass portion;

(d) a frequency translator that shifts the bass portion by a positive frequency increment that is an integer multiple of the fundamental frequency estimated by said estimator, thereby providing a virtual bass signal;

(e) an adder having (i) inputs coupled to said original audio signal and to said virtual bass signal and (ii) an output; and (f) an audio output device coupled to the output of said adder, wherein the integer multiple is determined as $$k = \left\lceil \frac{f_l^t}{f_l^b} \right\rceil - 1,$$

where k is the integer multiple, $f_l^b$ is a low-and cut off frequency of a bandpass filter that functions as the bass extraction filter, $f_l^t$ denotes a designated lowest acceptable frequency, and $\lceil x \rceil$ is a ceiling function which returns a smallest integer that is not less than x.

17. An apparatus for processing an audio signal, comprising:

(a) an input line that inputs an original audio signal in a time domain;

(b) a bass extraction filter that extracts a bass portion of said original audio signal, said extracted bass portion also being in the time domain;

(c) an estimator that estimates a fundamental frequency of a bass sound within said bass portion;

(d) a frequency translator that shifts the bass portion by a positive frequency increment that is an integer multiple of the fundamental frequency estimated by said estimator, thereby providing a virtual bass signal;

(e) an adder having (i) inputs coupled to said original audio signal and to said virtual bass signal and (ii) an output; and (f) an audio output device coupled to the output of said adder, wherein the integer multiple is determined as $$k = \left\lceil \frac{f_l^t}{F_0} \right\rceil - 1,$$

where k is the integer multiple, $F_0$ is the fundamental frequency, $f_l^t$ denotes a designated lowest acceptable frequency, and $\lceil x \rceil$ is a ceiling function which returns a smallest integer that is not less than x.

18. An apparatus for processing an audio signal, comprising:

(a) an input line that inputs an original audio signal in a time domain;

(b) a bass extraction filter that extracts a bass portion of said original audio signal, said extracted bass portion also being in the time domain;

(c) an estimator that estimates a fundamental frequency of a bass sound within said bass portion;

(d) a frequency translator that shifts the bass portion by a positive frequency increment that is an integer multiple of the fundamental frequency estimated by said estimator, thereby providing a virtual bass signal;

(e) an adder having (i) inputs coupled to said original audio signal and to said virtual bass signal and (ii) an output; and (f) an audio output device coupled to the output of said adder, wherein the integer multiple is determined as $$k = \left\lceil \frac{f_l^t + \frac{1}{2} f_h^b - f_l^b}{\frac{1}{2} f_h^b} \right\rceil - 1,$$

where k is the integer multiple, $f_l^t$ denotes a designated lowest acceptable frequency, $f_l^b$ is a low-end cutoff frequency of a bandpass filter that functions as the bass extraction filter, $f_h^b$ is a high-end cutoff frequency of the bass extraction filter, and $\lceil x \rceil$ is a ceiling function which returns a smallest integer that is not less than x.

19. An apparatus according to claim 1, further comprising a high-pass filter that suppresses frequencies within said original audio signal that are not capable of being efficiently converted into sound by said audio output device.

20. An apparatus according to claim 1, further comprising a delay element coupled between said input line and said adder that time-aligns the original audio signal with said virtual bass signal.

21. An apparatus according to claim 11, wherein said bass extraction filter is a bandpass filter having a low-end cutoff frequency of at least 15 Hz.

22. An apparatus according to claim 11, wherein said bass extraction filter is a bandpass filter having a passband of at least 1 octave.

23. An apparatus according to claim 11, wherein said bass extraction filter is a bandpass filter having a passband of at least 2 octaves.

24. An apparatus according to claim 11, further comprising a loudness controller that adjusts a strength of said virtual bass signal based on a first estimate of a perceived loudness of said bass portion and a second estimate of a perceived loudness of said virtual bass signal.

25. An apparatus according to claim 24, wherein the first estimate is based on an estimate of at least one of a sound pressure level (SPL) or a power of the bass portion.

26. An apparatus according to claim 11, wherein the fundamental frequency of said bass sound is constrained to fall within a one-octave range.

27. An apparatus according to claim 11, wherein said smoothing filter implements a smoothing function $\hat{F}_0(n) = \alpha\hat{F}_0(n-1)+(1-\alpha) F_0(n)$, where n is a number of the current frame number, $\hat{F}_0$is a smoothed version of $F_0$, and $\alpha$is a filter coefficient.

28. An apparatus according to claim 11, further comprising a high-pass filter that suppresses frequencies within said original audio signal that are not capable of being efficiently converted into sound by said audio output device.

29. An apparatus according to claim 11, further comprising a delay element coupled between said input line and said adder that time-aligns the original audio signal with said virtual bass signal.

* * * * *